United States Patent
Romenesko et al.

(10) Patent No.: US 8,115,441 B2
(45) Date of Patent: Feb. 14, 2012

(54) ON-LINE MEASUREMENT OF AN INDUCTION MACHINE'S ROTOR TIME CONSTANT BY SMALL SIGNAL D-AXIS CURRENT INJECTION

(75) Inventors: Charles J. Romenesko, Janesville, WI (US); Vijay K. Maddali, Roscoe, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 1243 days.

(21) Appl. No.: 11/880,070

(22) Filed: Jul. 19, 2007

(65) Prior Publication Data

US 2009/0021208 A1 Jan. 22, 2009

(51) Int. Cl.
H02P 23/14 (2006.01)
G05B 13/00 (2006.01)

(52) U.S. Cl. ........................................ 318/727; 318/807

(58) Field of Classification Search ................. 318/727, 318/798, 799, 805, 807, 610, 616; 324/602
See application file for complete search history.

(56) References Cited

U.S. PATENT DOCUMENTS

| | | | | |
|---|---|---|---|---|
| 4,677,360 A * | 6/1987 | Garces | ........................ | 318/803 |
| 5,476,158 A * | 12/1995 | Mann et al. | ..................... | 187/289 |
| 5,729,113 A * | 3/1998 | Jansen et al. | .................... | 318/799 |
| 5,909,018 A * | 6/1999 | Vecchiotti et al. | ............ | 187/393 |
| 5,929,400 A * | 7/1999 | Colby et al. | ................... | 187/393 |
| 6,316,904 B1 | 11/2001 | Semenov et al. | | |
| 6,509,711 B1 | 1/2003 | Zaremba | | |
| 6,661,194 B2 * | 12/2003 | Zaremba et al. | .............. | 318/727 |
| 6,683,428 B2 * | 1/2004 | Pavlov et al. | .................. | 318/432 |
| 6,870,348 B2 | 3/2005 | Mijalkovic et al. | | |
| 7,034,497 B2 | 4/2006 | Markunas et al. | | |
| 7,187,155 B2 * | 3/2007 | Matsuo et al. | ........... | 318/400.04 |
| 7,250,739 B2 * | 7/2007 | Heikkila | ........................ | 318/727 |
| 7,746,038 B2 * | 6/2010 | Maddali et al. | ................. | 322/63 |
| 2006/0273755 A1 * | 12/2006 | Heikkila | ........................ | 318/812 |
| 2008/0136380 A1 * | 6/2008 | Hoffmann et al. | .............. | 322/29 |
| 2009/0284211 A1 * | 11/2009 | Gao et al. | ....................... | 318/727 |

OTHER PUBLICATIONS

Kubota et al., "Speed Sensorless Field-Oriented Control of Induction Motor with Rotor Resistance Adaptation", IEEE Transactions on Industry Applications, vol. 30, No. 5, Sep./Oct. 1994, pp. 1219-1224.
Wu et al., "Induction-Motor Stator and Rotor Winding Temperature Estimation Using Signal Injection Method", IEEE Transactions on Industry Applications, vol. 42, No. 4, Jul./Aug. 2006, pp. 1038-1044.

* cited by examiner

*Primary Examiner* — Eduardo Colon Santana
(74) *Attorney, Agent, or Firm* — Kinney & Lange, P.A.

(57) ABSTRACT

A controller continually updates rotor time constant estimation of an induction machine by interrogating the induction machine with a small signal oscillation and monitoring the response. The small signal oscillation is injected onto the d-axis current command signal, and is generated at a frequency that represents the most recent estimate of the rotor time constant (i.e., rotor time constant equal the inverse of the frequency). The controller monitors rotor flux generated in response to the small signal oscillation, and updates the most recent estimate of the rotor time constant based on the monitored rotor flux. This process is repeated continuously to allow for the continuous updating of the rotor time constant.

21 Claims, 4 Drawing Sheets

ON-LINE MEASUREMENT OF AN INDUCTION MACHINE'S ROTOR TIME CONSTANT BY SMALL SIGNAL D-AXIS CURRENT INJECTION

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract number F33615-00-2-2002 awarded by the Air Force Research Labs of the U.S. Department of Defense.

BACKGROUND

The present invention relates to induction machines, and in particular to field oriented control (FOC) of induction machines.

Field Oriented Control (FOC) is a well-known method of controlling induction machines. In short, field oriented control transforms space vectors from a three-axis stationary reference frame (abc) to a two-axis rotating reference frame (dq). Field oriented control allows for precise control of induction machines. In particular, the d-q reference frame allows the rotor flux or direct component (d-axis component) and the torque or quadrature component (q-axis component) of a commanded current signal to be independently controlled. Thus, the rotor flux and torque produced in an induction machine can be precisely controlled.

A typical implementation of FOC uses transforms to convert from the three-axis stationary reference frame (abc) to the two-axis rotating reference frame (dq) (as applied to a three phase machine). The two-axis reference frame can be aligned with the rotor flux or, in the alternative, can be aligned with the stator flux or air gap flux. Aligning the rotating reference frame with the rotor flux allows the decoupling of the d-axis current (used for rotor flux production) and the q-axis current (used for torque production). This decoupling is the heart of FOC, and is accomplished by providing the induction machine with the correct slip frequency and stator currents (magnitude and angle).

The accuracy, effectiveness, and dynamic performance of a particular FOC scheme rest on the ability to correctly determine the required slip frequency and q-axis current vector for a desired torque and rotor flux command. Correctly determining these values depends in part on accurately estimating induction machine circuit parameters. The rotor time constant associated with the induction machine is of particular importance for these calculations and is expressed as rotor inductance divided by rotor resistance (Lr/Rr). Because resistance of the induction machine changes with the temperature of the rotor, it is not sufficient to use nominal parameters continuously for good dynamic performance. Furthermore, since the rotor is moving, it is difficult to obtain temperature measurements for direct compensation with temperature. Therefore, accurate estimation or measurement of the rotor time constant is an important aspect of field oriented control.

SUMMARY

A controller for an induction machine makes on-line measurements of a rotor time constant associated with an induction machine by injecting a small signal on the d-axis current command at a selected frequency. The controller selects the frequency of the small signal oscillation based on a most recent estimate of the rotor time constant. The rotor time constant is estimated and updated by monitoring the rotor flux generated in response to the small signal oscillation. Based on a new estimate of the rotor time constant, the frequency of the small signal oscillation is updated and injected onto the d-axis current command. In this way, the controller continually interrogates the induction machine with the small signal injection, monitors the response, and updates estimates of the rotor time constant and frequency associated with the small signal oscillation.

DETAILED DESCRIPTION

Figure 1:
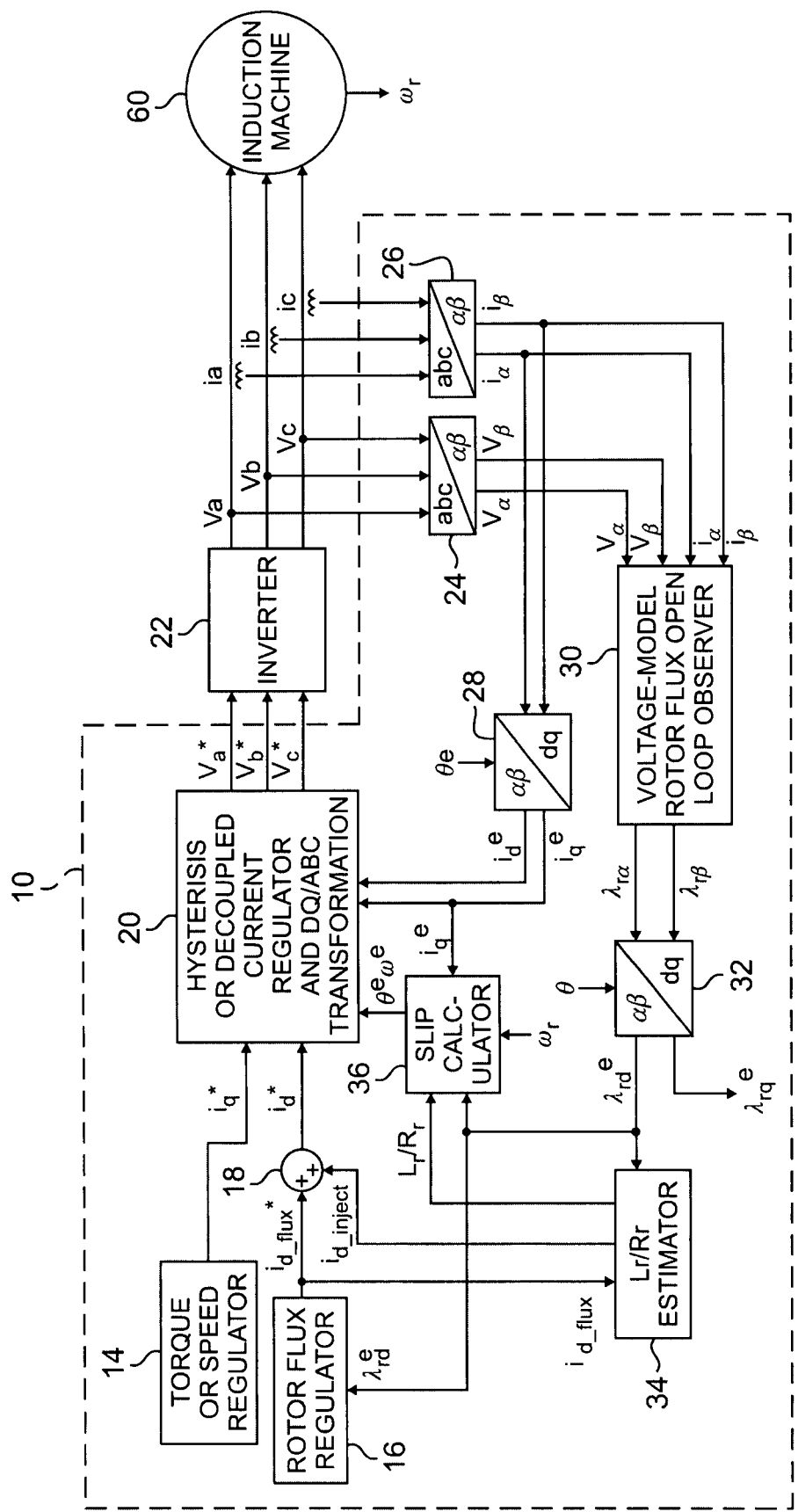
FIG. 1 is a block diagram of signal processing operations performed by a controller that employs field oriented control and on-line rotor time constant measurement to provide command signals to an induction machine.

FIG. 1 is a block diagram illustrating signal-processing steps performed by controller 10 for generating command signals that are provided to induction machine 12 using field oriented control (FOC). Controller 10 may be implemented by a digital signal processor (DSP) or an equivalent device capable of performing the signal processing calculations shown. In the embodiment shown in FIG. 1, and discussed throughout the application, three-phase input is provided to induction machine 12. Based on torque (quadrature or q-axis) current command signal $i_q^*$ and rotor flux (direct or d-axis) current command signal $i_d^*$, which represent the desired amount of torque and rotor flux to be generated in induction machine 12, controller 10 generates voltage command signals $v_a^*$, $v_b^*$, and $v_c^*$ that are applied, through an inverter, to the stator of induction machine 12. In addition, the embodiment shown in FIG. 1 is implemented using indirect field oriented control, although other embodiments may make use of direct field oriented control.

In particular, the signal processing steps shown in FIG. 1 illustrate a method for making on-line (i.e., during operation) closed-loop measurements of the rotor time constant $L_r/R_r$ associated with induction machine 12. To make on-line measurements of the rotor time constant $L_r/R_r$, the controller injects a small signal (oscillating) input $i_{d\_inject}$ onto the d-axis current command signal $i_{d\_flux}^*$ at a selected frequency, and measures the response in the monitored rotor flux estimate $\lambda_{rd}^e$. The selected frequency of the small signal input $i_{d\_inject}$ represents the current estimate of the rotor time constant $L_r/R_r$ (i.e., frequency of the small signal input in radians/sec is the inverse of the estimated rotor time constant). Based on the monitored d-axis rotor flux estimate $\lambda_{rd}^e$ generated in response to the small signal input $i_{d\_inject}$, the present estimate of the rotor time constant $L_r/R_r$ can be updated. Based on the updated estimate of the rotor time constant $L_r/R_r$, the frequency of the small signal input $i_{d\_inject}$ is updated and supplied to the induction machine. In this way, the induction machine is continuously interrogated by the small signal input $i_{d\_inject}$, and the resulting estimate of the rotor time constant $L_r/R_r$ is continuously updated based on the measured response to the small signal input.

Signal processing components and steps of controller 10 for controlling the operation of induction machine 12 include torque or speed regulator 14, rotor flux regulator 16, signal summer 18, decoupled current regulator and d-q/abc transform 20 ("current regulator 20"), voltage abc/αβ transform 24, current abc/αβ transform 26, current αβ/dq transform 28, voltage model rotor flux open loop observer 30, rotor flux αβ/dq transform 32, rotor time constant ($L_r/R_r$) estimator 34, and slip calculator 36.

In general, FOC control of induction machine 12 involves using a torque command to generate a q-axis current command signal $i_q^*$ (via torque regulator 14) and a rotor flux command to generate a d-axis current command signal $i_d^*$ (via a rotor flux regulator 16). These commands are used to regulate the actual induction machine currents measured and transformed into $i_q^e$ and $i_d^e$ in the decoupled current regulator making use of the electrical frequency $\omega^e$ (or hysteresis current regulator) 20. Current regulation in the dq frame is well known by those skilled in the art. In this way, control of the rotor flux and torque generated in induction machine 12 is done independent of one another through the d-axis and q-axis currents.

The output of decoupled current regulator 20 is a voltage command signals $v_q^*$ and $v_d^*$ (not shown) in the d-q reference frame, which are then converted to voltage commands $v_a^*$, $v_b^*$, and $v_c^*$ and sent to the inverter 22. The transformation of the commanded voltage signals $v_d^*$ and $v_q^*$ from the d-q reference frame to the abc reference frame uses an the position of the electrical frequency $\theta^e$. The electrical frequency $\omega^e$ and the position of the electrical frequency $\theta^e$ are generated by slip calculator 36 and are based on inputs that include the commanded (or estimated) rotor flux $\lambda_{rd}^e$, measured (or commanded) q-axis current $i_q^e$, rotor speed $\omega_r$, and rotor time constant $L_r/R_r$. The accuracy of calculations made by slip calculator 36 depends, in part, on the instantaneous accuracy of the rotor time constant $L_r/R_r$ of induction machine 12.

In the embodiment shown in FIG. 1, both voltages ($v_a$, $v_b$, and $v_c$) and currents ($i_a$, $i_b$, and $i_c$) generated in the stator portion of induction machine 12 are monitored. In other embodiments, the commanded voltage signals va*, vb*, and vc* and knowledge of the DC link voltage in inverter 22 may be used instead of measuring the output voltages directly. As shown in steps 24 and 26, respectively, the monitored voltages and currents are converted to the α, β reference frame ($v_\alpha$, $v_\beta$ and $i_\alpha$, $i_\beta$, respectively). The monitored currents $i_\alpha$ and $i_\beta$ are further converted to the d-q reference frame at step 28, resulting in estimated torque current $i_q^e$ and estimated rotor flux current $i_d^e$. As discussed above with respect to converting from the d-q reference frame to the abc reference frame and converting from the αβ reference frame to the d-q reference frame, the angular position $\theta^e$ corresponding to electrical frequency $\omega_e$ is used. The monitored rotor flux current $i_d^e$ and monitored torque current $i_q^e$ values are provided to decoupled current regulator 20, as discussed above.

The monitored currents $i_\alpha$ and $i_\beta$ and the monitored voltages $v_\alpha$ and $v_\beta$ are employed by voltage-model rotor flux open loop observer 30 to calculate the rotor flux $\lambda_{r\alpha}$ and $\lambda_{r\beta}$. The voltage-model rotor flux open loop observers are well known in the art for calculating rotor fluxes based on voltages and currents induced in the stator. A voltage model rotor flux open loop observer is employed in this embodiment, as opposed to a current model (which is also well known in the art), because voltage flux observers are not sensitive to the rotor time constant of induction machine 12.

The estimated rotor flux $\lambda_{r\alpha}$ and $\lambda_{r\beta}$ are then converted from the αβ reference frame to the dq reference frame ($\lambda_{rq}^e$ and $\lambda_{rd}^e$) at step 32. Once again, the position of the electrical frequency $\theta^e$ is required to convert from the αβ reference frame to the dq reference frame. The d-axis rotor flux estimate $\lambda_{rd}^e$ is used by rotor time constant estimator 34 to calculate the rotor time constant $L_r/R_r$ that is provided to slip calculator 36. In addition, the d-axis rotor flux estimate $\lambda_{rd}^e$ is provided to slip calculator 36.

Figure 2:
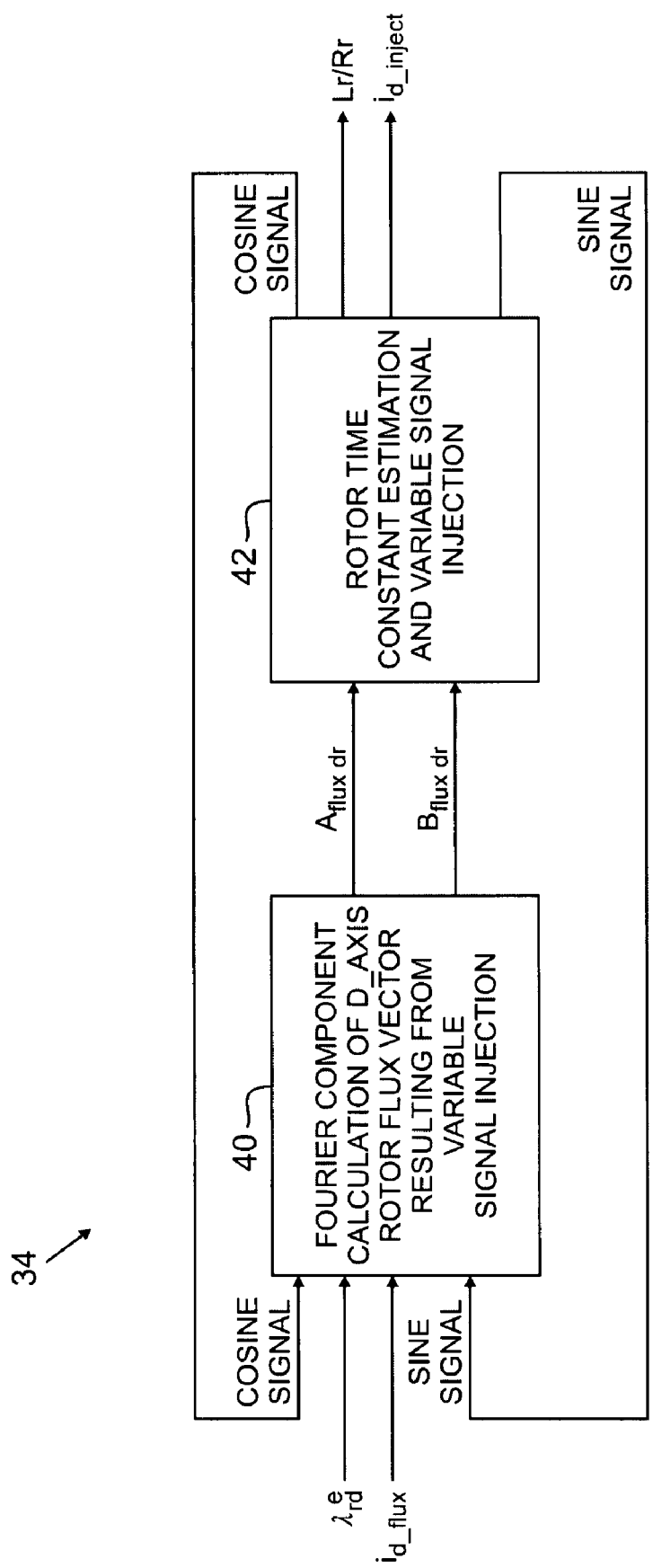
FIG. 2 is a block diagram of signal processing operations for measuring the rotor time constant (Lr/Rr).
Figure 3:
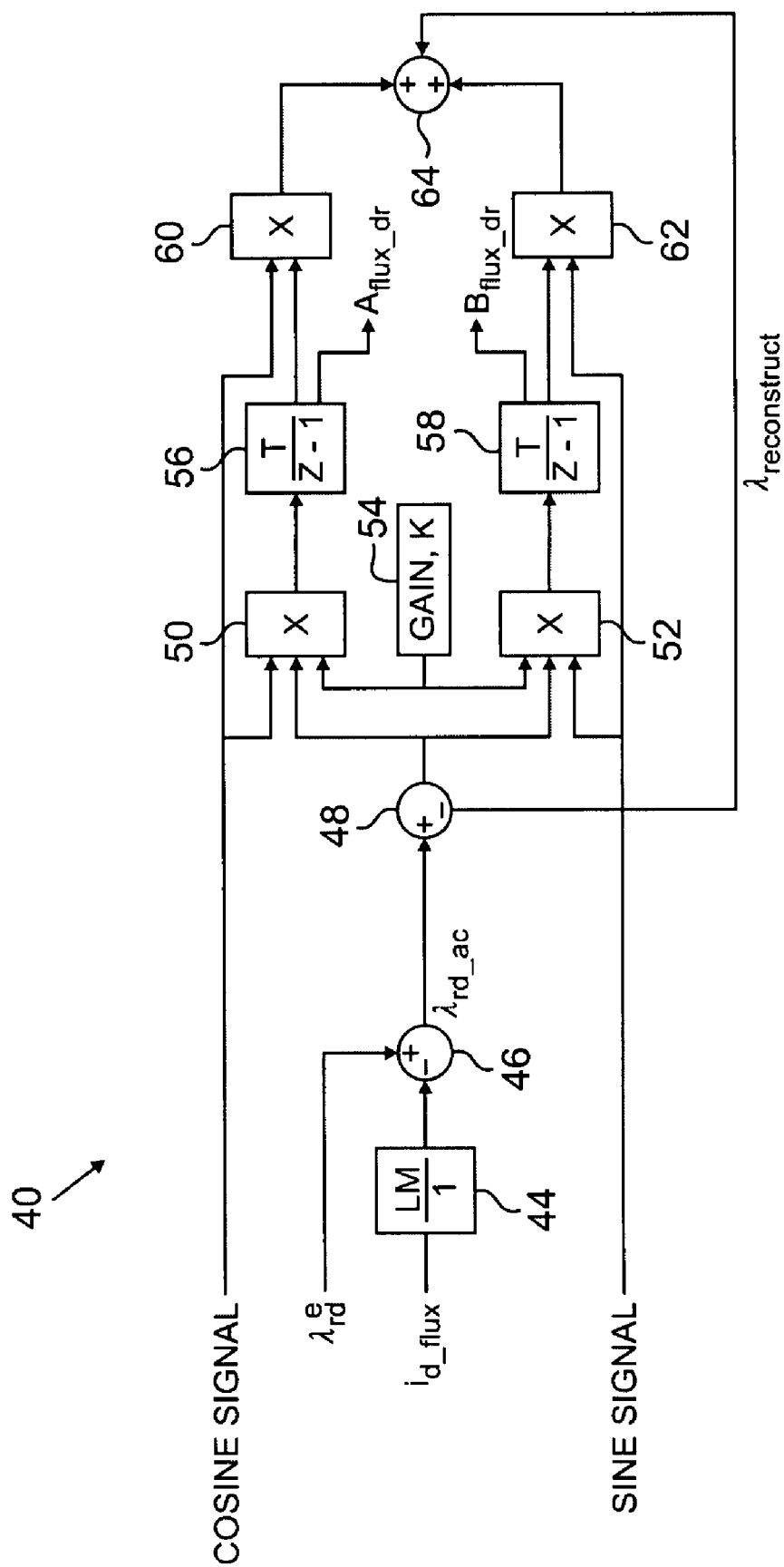
FIG. 3 is a block diagram of signal processing operations employed to calculate the Fourier component of the rotor flux vector resulting from the signal injection as shown in FIG. 2.
Figure 4:
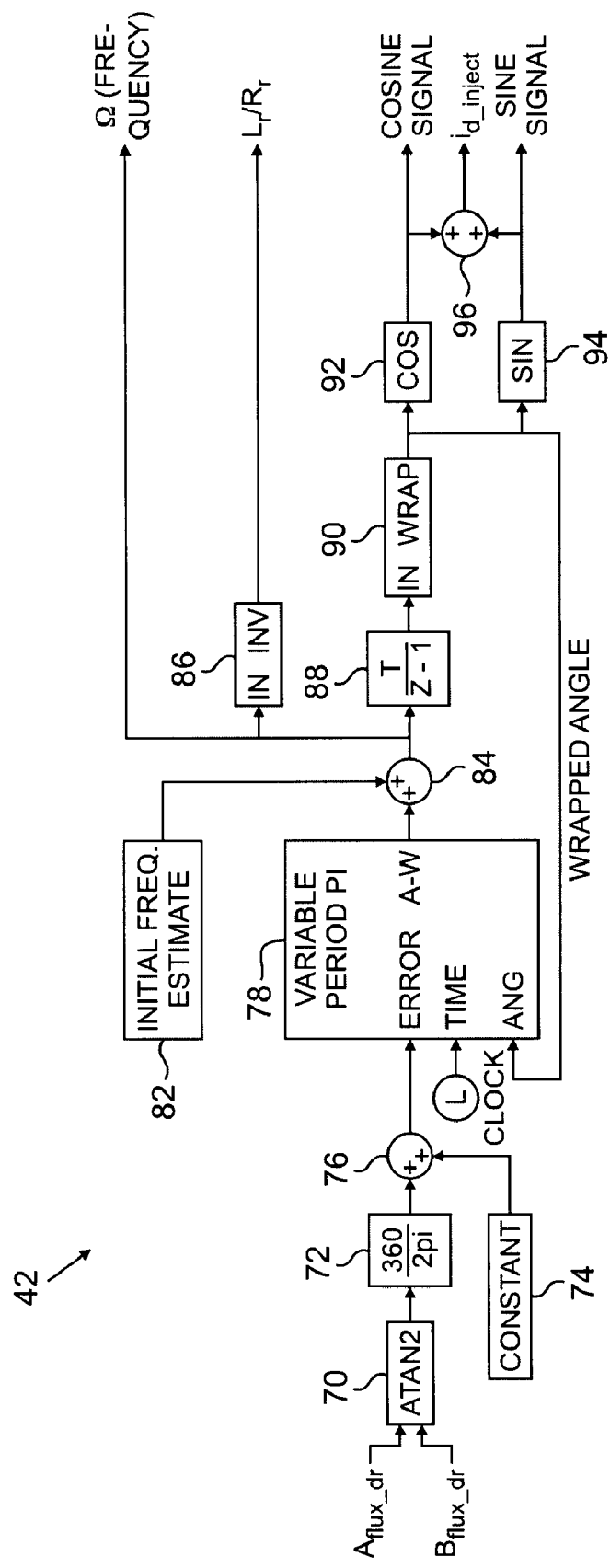
FIG. 4 is a block diagram of signal processing operations employed to calculate the rotor time constant based on the Fourier coefficients of the rotor flux vector shown in FIG. 3.

Rotor time constant estimator 34 is discussed in more detail with respect to FIGS. 2-4. In general, rotor time constant estimator 34 uses the d-axis rotor flux estimate $\lambda_{rd}^e$, and in particular the small signal portion of the d-axis rotor flux estimate $\lambda_{rd}^e$ generated in response to the small signal input $i_{d\_inject}$ injected into the rotor flux current command signal $i_{d\_flux}^*$, to estimate the rotor time constant $L_r/R_r$. In particular, calculating the rotor time constant based on the flux response to the small signal input $i_{d\_inject}$ is based on the fact that because induction machine 12 is an inductive load, current injected at the proper frequency (i.e., correct estimate of the rotor time constant) will result in a flux signal that lags the injected current by forty-five degrees. Detecting changes in the phase of the flux signal allows for the detection of changes to the rotor time constant $L_r/R_r$. In this way, induction machine 12 is continuously interrogated by a small signal input $i_{d\_inject}$ having a frequency that represents the most recent estimate of the induction machine's rotor time constant $L_r/R_r$.

FIG. 1 therefore illustrates a method of implementing field oriented control (in this case, indirect field oriented control, although direct field oriented control could also be employed) that makes continual adjustments to the rotor time constant estimation in order to accurately calculate the slip frequency (and therefore the position of electrical frequency $\theta^e$). FIGS. 2-4 illustrate in more detail an embodiment of a method employed to make on-line measurements of the rotor time constant $L_r/R_r$.

FIGS. 2-4 illustrate in an embodiment of steps performed by the controller in generating the small signal input $i_{d\_inject}$ to be added to the rotor flux current command signal $i_{d\_flux}^*$ and calculating the rotor time constant $L_r/R_r$. As will be discussed below, the rotor time constant $L_r/R_r$ is continuously updated by injecting the small signal input $i_{d\_inject}$ into the rotor flux current command signal $i_{d\_flux}^*$ and measuring the d-axis rotor flux $\lambda_{rd}^e$ generated as a result. In particular, FIG. 2 illustrates the two stages of calculations performed by rotor time constant estimator 34, Fourier coefficient calculation of the direct rotor flux component resulting from the variable signal current injection 40 ("Fourier coefficient calculator 40"), and rotor time constant $L_r/R_r$ estimation and variable signal injection 42 ("time constant and signal injection calculator 42"). Fourier coefficient calculator 40 takes as input the estimated d-axis rotor flux $\lambda_{rd}^e$, the d-axis current command signal $i_{d\_flux}^*$, and cosine and sine signals provided by rotor time constant calculator 42. Based on these inputs, Fourier coefficient calculator 40 generates Fourier coefficients $A_{flux\_dr}$ and $B_{flux\_dr}$, which reflect changes in the rotor time constant detected by analyzing the estimated d-axis rotor flux $\lambda_{rd}^e$.

In one embodiment (discussed in more detail with respect to FIG. 4), the injected small signal $i_{d\_inject}$ is generated by summing the cosine and sine signals generated by rotor time constant estimator 42. The frequency of cosine and sine signals (and thus, the frequency of injected small signal $i_{d\_inject}$ formed by summing the cosine and sine signals) is based on the latest estimate of the rotor time constant $L_r/R_r$. As a result of summing the cosine and sine signals, the injected small signal $i_{d\_inject}$ leads the sine signal by forty-five degrees and lags the cosine signal by forty-five degrees. Because the induction machine acts as an inductive load, the resulting flux (described in more detail with respect to FIG. 3, and labeled $\lambda_{rd\_ac}$) generated in response to the injected small signal $i_{d\_inject}$ will lag the injected small signal $i_{d\_inject}$ by forty-five degrees (assuming the frequency of the injected small signal $i_{d\_inject}$ represents the correct estimate of the rotor time constant) and will be in phase with the sine signal used to generate the injected small signal $i_{d\_inject}$. The resulting flux $\lambda_{rd\_ac}$ (shown in FIG. 3) generated in response to the injected small signal $i_{d\_inject}$ is monitored, and changes in the phase of the resulting flux are used to detect changes in the rotor time constant. In particular, Fourier component calculator 40 generates Fourier coefficients $A_{flux\_dr}$ and $B_{flux\_dr}$ in response to detected changes in the phase of the resulting flux $\lambda_{rd\_ac}$.

The Fourier coefficients $A_{flux\_dr}$ and $B_{flux\_dr}$ are provided to time constant calculator 42, and represent detected changes in the phase of the AC component of the d-axis flux $\lambda_{rd\_ac}$ generated in response to the injected small signal $i_{d\_inject}$. Based on these coefficients, time constant calculator 42 uses proportional-integral (PI) control to adjust the estimated time constant $L_r/R_r$. In modifying the rotor time constant estimation, the frequency of the small signal input $i_{d\_inject}$ injected as part of the rotor flux current command signal $i_d^*$ is also adjusted. Adjustments made to the frequency of the small signal input $i_{d\_inject}$ results in continued interrogation and estimation of the rotor time constant $L_r/R_r$.

FIG. 3 illustrates in more detail the processing steps employed by Fourier coefficient calculator 40 to calculate the Fourier coefficients $A_{flux\_dr}$ and $B_{flux\_dr}$. In general, the processing steps shown in FIG. 3 act to isolate the portion of the d-axis rotor flux $\lambda_{rd}^e$ generated in response to the small signal input $i_{d\_inject}$ injected into the d-axis current command signal $i_{d\_flux}^*$. That is, the alternating current (AC) component of the d-axis rotor flux $\lambda_{rd}^e$ is isolated. Following the isolation of the AC component of the d-axis rotor flux (labeled here as $\lambda_{rd\_ac}$) changes in the angle (i.e., the phase) of the AC component due to variations in the actual rotor time constant are detected. The change in phase of the AC component is represented by the Fourier coefficients $A_{flux\_dr}$ and $B_{flux\_dr}$. In particular, these calculations are premised on the fact that flux generated in response to the injected small signal current $i_{d\_inject}$ will lag the injected small signal current $i_{d\_inject}$ by forty-five degrees if the frequency of the injected small signal current represents the correct estimate of the rotor time constant $L_r/R_r$. Therefore, the flux generated in response to the injected small signal current will be in phase with the sine signal used to generate the injected small signal current $i_{d\_inject}$.

In the embodiment shown in FIG. 3, the d-axis current command signal $i_{d\_flux}$ is converted from a current representation to a flux representation (i.e., phase shifted based on inductance $L_m$) at step 44. The flux representation of d-axis current command signal $i_{d\_flux}$ is compared to the monitored d-axis rotor flux $\lambda_{rd}^e$ at step 46. Because the commanded d-axis current does not contain the small signal injection, the comparison at step 46 removes the DC component of the d-axis rotor flux $\lambda_{rd}^e$, leaving the AC component (denoted here as $\lambda_{rd\_ac}$) of the d-axis rotor flux $\lambda_{rd}^e$. In particular, the AC component of the d-axis rotor flux $\lambda_{rd\_ac}$ includes the flux response to the small signal injection $i_{d\_inject}$. In addition, the AC component of the d-axis rotor flux $\lambda_{rd\_ac}$ may include unwanted noise that is filtered in subsequent steps.

At step 48, the AC component of the d-axis rotor flux $\lambda_{rd\_ac}$ is compared to a reconstructed d-axis rotor flux $\lambda_{reconstruct}$. In the embodiment shown in FIG. 3, the reconstructed d-axis rotor flux $\lambda_{reconstruct}$ is the product of a closed-loop system for monitoring phase changes in the AC component of the d-axis rotor flux $\lambda_{rd\_ac}$. Thus, the reconstructed d-axis rotor flux $\lambda_{reconstruct}$ is an ideal or clean (i.e., very little noise) signal that represents the expected rotor flux response to the small signal input $i_{d\_inject}$ injected into the commanded d-axis current $i_{d\_flux}^*$. As shown in FIG. 3, the reconstructed rotor flux $\lambda_{reconstruct}$ is based on the Fourier coefficients defined by $A_{flux\_dr}$ and $B_{flux\_dr}$ and cosine and sine signals, respectively, used to generate the injected small signal $i_{d\_inject}$. Thus, if the frequency of the small signal input $i_{d\_inject}$ accurately reflects the actual rotor time constant of induction machine 12, then the reconstructed d-axis rotor flux $\lambda_{reconstruct}$ should be in phase with the AC component of the d-axis rotor flux $\lambda_{rd\_ac}$ (i.e., both should lag the commanded d-axis current $i_{d\_flux}^*$ by 45 degrees). If the AC component of the d-axis rotor flux $\lambda_{rd\_ac}$ is not in phase with the reconstructed d-axis rotor flux $\lambda_{reconstruct}$, the difference in phase will result in an error signal.

For example, in one embodiment the Fourier coefficient $A_{flux\_dr}$ may be initialized to a value of '0' and the Fourier coefficient $B_{flux\_dr}$ may be initialized to a value of '1'. The result is a reconstructed rotor flux $\lambda_{reconstruct}$ that is represented by only the sine signal component used to generate the small signal injection $i_{d\_inject}$. Because the sine signal component lags the small signal injection $i_{d\_inject}$ by forty-five degrees, the reconstructed rotor flux $\lambda_{reconstruct}$ can be compared to the AC component of the d-axis rotor flux $\lambda_{rd\_ac}$ to detect changes in the phase of the AC component of the d-axis rotor flux $\lambda_{rd\_ac}$ (i.e., the AC component of the d-axis rotor flux $\lambda_{rd\_ac}$ will lag or lead the injected small signal $i_{d\_inject}$ by more or less than forty-five degrees).

The error signal generated by comparing the AC component of the d-axis rotor flux $\lambda_{rd\_ac}$ to the reconstructed d-axis rotor flux $\lambda_{reconstruct}$ at step 48 is multiplied by gain value K (box 54) and further multiplied by a cosine signal and a sine signal (the generation of these signals are shown in more detail in FIG. 4), respectively, at steps 50 and 52. Multiplying the error calculated at step 48 by the cosine signal at step 50 (along with the gain constant K) results in a signal having a DC component and a frequency component. Similarly, multiplying the error calculated at step 48 by the sine signal at step 52 (along with the gain constant K) results in a signal having a DC component and a frequency component. The Fourier coefficients $A_{flux\_dr}$ and $B_{flux\_dr}$ are generated at steps 56 and 58 by integrating the DC components generated at steps 50 and 52, respectively. The Fourier coefficients $A_{flux\_dr}$ and $B_{flux\_dr}$ are provided to time constant calculator 42, which as discussed in more detail with respect to FIG. 4, uses the Fourier coefficients $A_{flux\_dr}$ and $B_{flux\_dr}$ to estimate the rotor time constant.

In addition, the Fourier coefficient $A_{flux\_dr}$ is multiplied with the cosine signal provided by rotor time constant estimator 42 at step 60 and Fourier coefficient $B_{flux\_dr}$ is multiplied with the sine signal also provided by rotor time constant estimator 42 at step 62. The resulting sine and cosine signals are summed together at step 64 to generate the reconstructed d-axis flux $\lambda_{reconstruct}$. In closed-loop fashion, the reconstructed d-axis rotor flux $\lambda_{reconstruct}$ is compared with the AC component of the d-axis rotor flux such that the response to the injected small signal $i_{d\_inject}$ is continuously monitored to detect changes in the phase of the flux response to the injected small signal $i_{d\_inject}$. In this way, the goal of the closed system is to adjust the Fourier coefficients such that the reconstructed d-axis rotor flux $\lambda_{reconstruct}$ equals the AC component of the d-axis rotor flux $\lambda_{rd\_ac}$ generated in response to the injected small signal $i_{d\_inject}$.

FIG. 4 illustrates how the Fourier coefficients $A_{flux\_dr}$ and $B_{flux\_dr}$, calculated in FIG. 3, are used to modify the estimated rotor time constant $L_r/R_r$ as well as the frequency of the small signal input $i_{d\_inject}$.

At step 70, an arctangent operation is performed on the Fourier coefficients $A_{flux\_dr}$ and $B_{flux\_dr}$ (specifically, arctan $(A_{flux\_dr}/B_{flux\_dr})$), with the output expressed in radians and representing the phase difference between the reconstructed d-axis rotor flux $\lambda_{reconstruct}$ and the AC component of the d-axis rotor flux $\lambda_{rd\_ac}$ generated in response to the injected small signal current $i_{d\_inject}$. For example, in one embodiment, if there is no difference between the reconstructed d-axis rotor flux signal reconstruct and the reference frequency sinusoidal signal (i.e., they are in phase with one another), then $A_{flux\_dr}$ will equal '0', with the arctangent operation resulting in a zero radian difference (i.e., in phase). If there is a difference between the two signals, then the difference will be represented by the result of the arctangent operation, and converted to degrees at step 72. The resulting phase difference between the two signals, expressed in degrees, is added to a constant 'c', which represents a correction offset, at step 76 and provided as an input to PI controller 78.

In general, PI controller 78 adjusts the estimate of the rotor time constant based on the phase difference provided as an input to PI controller 78. Adjusting the estimate of the rotor time constant results in an adjustment of the frequency of the small signal input $i_{d\_inject}$ provided to induction machine 12. PI controller 78 adjusts the initial frequency estimate until the phase difference calculated from $A_{flux\_dr}$ and $B_{flux\_dr}$ is minimized (i.e., until the error provided to the input of PI controller 78 is driven to zero). That is, PI controller 78 selectively controls the frequency estimate $\Omega$, which represents the frequency of the small signal current $i_{d\_inject}$ and the inverse of the rotor time constant estimate $L_r/R_r$, until the rotor time constant estimate $L_r/R_r$ is brought in line with actual circuit parameters of induction machine 12.

Specifically, output of PI controller 78 is added to an initial frequency estimate at step 84 to generate the frequency estimate $\Omega$ and the rotor time constant $L_r/R_r$, which is calculated by taking the inverse of the frequency estimate $\Omega$ at step 86. In addition, the frequency of the small signal current $i_{d\_inject}$ is modified to equal the new frequency estimate $\Omega$ at steps 88, 90, 92, 94, and 96. The frequency estimate $\Omega$ is provided to discrete integrator 88, and wrapped angle generator 90 (which generates a sawtooth signal that is provided as a timing input to PI controller 78), and then divided into cosine and sine components at steps 92 and 94, respectively. The sine and cosine components, generated at the frequency estimate $\Omega$ are provided in feedback to Fourier component calculator 40, while the small signal input $i_{d\_inject}$ (also generated at the new frequency estimate $\Omega$ and advanced by forty-five degrees) is injected into the commanded d-axis current $i_{d\_flux}*$ as shown in FIG. 1. In this way, the method described with respect to FIGS. 1-4 provides for the continual interrogation of an induction machine by a small signal input $i_{d\_inject}$ at a frequency that represents a most recent estimate of the rotor time constant. The rotor flux generated in response to the small signal input $i_{d\_inject}$ is used to modify the most recent estimate of the rotor time constant, and to modify the frequency of the small signal input $i_{d\_inject}$ for subsequent interrogations of the induction machine.

Although the present invention has been described with reference to preferred embodiments, workers skilled in the art will recognize that changes may be made in form and detail without departing from the spirit and scope of the invention. In particular, the processing steps discussed with respect to FIGS. 1-4 illustrate one method of generating the small signal oscillation and measuring the response to detect changes in the rotor time constant. The continuous interrogation of the induction machine to generate continuous estimations of the rotor time constant may be accomplished with a variety of signal processing architectures.

The invention claimed is:

1. A method for making on-line measurements of a rotor time constant associated with an induction machine, the method comprising:
   a. interrogating the induction machine with a small signal oscillation generated at a frequency selected based on a most recent estimate of the rotor time constant;
   b. monitoring the response of the induction machine by monitoring a rotor flux generated in response to the small signal oscillation;
   c. detecting within the rotor flux a rotor flux component generated in response to the small signal oscillation;
   d. detecting a phase associated with the rotor flux component generated in response to the small signal oscillation;
   e. updating the most recent estimate of the rotor time constant and the frequency of the small signal oscillation based on the detected phase of the rotor flux component generated in response to the small signal oscillation; and
   f. repeating steps a-e.

2. The method of claim 1, wherein interrogating the induction machine with a small signal oscillation includes:
   injecting the small signal oscillation onto a d-axis current command signal.

3. The method of claim 1, wherein monitoring the response of the induction machine includes:
   monitoring voltages and currents generated in the induction machine; and
   calculating rotor flux generated in the induction machine based on the monitored voltage and currents using a voltage model rotor flux open loop observer.

4. The method of claim 1, wherein updating the most recent estimate of the rotor time constant and the frequency of the small signal oscillation includes:
   generating a reconstructive rotor flux having a phase that is selected to minimize a difference in phase between the reconstructive rotor flux and the rotor flux component generated in response to the small signal oscillation;
   calculating a phase difference between the rotor flux component generated in response to the small signal oscillation and the reconstructed rotor flux;
   providing the phase difference to a proportional-integral (PI) controller that updates the most recent estimate of the rotor time constant, the frequency of the small signal oscillation, and the frequency of the reconstructive rotor flux based on the calculated phase difference; and
   modifying the phase associated with the reconstructive rotor flux based on the calculated phase difference to minimize the difference in phase between the reconstructive rotor flux and the rotor flux component generated in response to the small signal oscillation.

5. The method of claim 1, further including:
   calculating a position association with an electrical frequency used for field oriented control operations based, in part, on the most recent estimation of the rotor time constant.

6. A controller for controlling operation of an induction machine based on field oriented control, the controller including:
   means for controlling inputs to a stator of an induction machine based on commanded d-axis and q-axis current command signals, a calculated position associated with an electrical frequency, and monitored feedback regarding the present value of d-axis and q-axis currents in the induction machine;

means for generating and injecting a small signal oscillation onto the d-axis current command signal, the small signal oscillation generated at a desired frequency;

means for estimating d-axis rotor flux generated in the induction machine in response to the small signal oscillation injected onto the d-axis current command signal;

means for updating an estimate of the rotor time constant based, in part, on the monitored d-axis rotor flux generated in response to the small signal oscillation;

means for comparing the d-axis rotor flux generated in response to the small signal oscillation to a reconstructed d-axis rotor flux generated based, in part, on previous comparisons between the d-axis rotor flux generated in response to the small signal oscillation and the reconstructed d-axis rotor flux;

means for detecting a phase difference between the estimated d-axis rotor flux and the reconstructed d-axis rotor flux; and means for modifying the estimation of the rotor time constant based on the detected phase difference;

means for modifying the desired frequency of the small signal oscillation based on the present estimated value of the rotor time constant; and means for adjusting the calculated position associated with the electrical frequency used to generate the inputs provided to the stator of the induction machine based, in part, on the present estimated value of the rotor time constant.

7. The controller of claim 6, wherein the means for estimating the d-axis rotor flux generated in the induction machine in response to the small signal oscillation includes:

means for estimating a d-axis rotor flux generated by the induction machine based on monitored voltages and current generated in the induction machine; and means for comparing the estimated rotor flux with the d-axis current command signal to isolate the d-axis rotor flux generated in response to the small signal oscillation injected onto the d-axis current command.

8. The controller of claim 6, wherein the means for modifying the estimation of the rotor time constant and the means for modifying the desired frequency of the small signal oscillation include:

a proportional-integral (PI) controller that receives as input the detected phase difference between the d-axis rotor flux generated in response to the small signal oscillation and the reconstructed rotor flux and updates the estimate of the rotor time constant, thereby modifying the desired frequency of the small signal injection and the reconstructed rotor flux, such that the detected phase difference at the input of the PI controller is minimized.

9. The controller of claim 6, wherein the means for detecting a phase difference between the d-axis rotor flux generated in response to the small signal oscillation and the reconstructed rotor flux includes:

means for calculating Fourier coefficients based on the comparison between the d-axis rotor flux generated in response to the small signal oscillation and the reconstructed rotor flux;

means for calculating the phase difference based on the calculated Fourier coefficients; and means for generating the reconstructed rotor flux based on the Fourier coefficients.

10. A method of making on-line measurements of a rotor time constant associated with an induction machine, the method comprising:

generating a small signal oscillation at a determined frequency;

providing the small signal oscillation to the induction machine as an input;

measuring rotor flux generated by the induction machine in response to the small signal oscillation;

estimating a present value of the rotor time constant based on a position of the measured rotor flux generated in response to the input small signal oscillation;

comparing the measured rotor flux generated in response to the small signal oscillation to a reconstructed rotor flux generated based, in part, on previous comparisons between the rotor flux generated in response to the small signal oscillation and the reconstructed rotor flux;

detecting a phase difference between the estimated rotor flux and the reconstructed rotor flux;

modifying the estimation of the rotor time constant based on the detected phase difference; and modifying the determined frequency of the small signal oscillation based on the estimated rotor time constant.

11. The method of claim 10, wherein providing the small signal oscillation to the induction machine includes:

injecting the small signal oscillation into a d-axis commanded current signal; and generating voltage command signals that are provided to the induction machine based, in part, on the d-axis commanded current signal with injected small signal oscillation.

12. The method of claim 10, wherein measuring rotor flux generated by the induction machine in response to the small signal oscillation includes:

monitoring voltage and current generated in the induction machine; and measuring rotor flux based on the monitored voltage and current using a voltage model rotor flux open loop observer.

13. The method of claim 10, wherein modifying the estimation of the rotor time constant includes:

providing the detected phase difference to a proportional-integral (PI) controller that modifies the estimation of the rotor time constant to minimize the phase difference.

14. The method of claim 10, wherein detecting the phase difference between the estimated rotor flux and the reconstructed rotor flux includes:

calculating Fourier coefficients based on the comparison between the measured rotor flux and the reconstructed rotor flux; and calculating the phase difference based on the calculated Fourier coefficients.

15. The method of claim 14, wherein the reconstructed rotor flux is generated based, in part, on the calculated Fourier coefficients.

16. The method of claim 15, wherein the reconstructed rotor flux is generated based, in part, on the estimate of the rotor time constant used to generate the small signal oscillation.

17. A controller for controlling an induction machine, the controller comprising:

means for interrogating the induction machine with a small signal oscillation generated at a frequency selected based on a most recent estimate of the rotor time constant;

means for monitoring the response of the induction machine by measuring a rotor flux generated in response to the small signal oscillation;

means for comparing the rotor flux component generated in response to the small signal oscillation to a reconstructed rotor flux generated in a closed loop to minimize a phase difference between rotor flux component generated in response to the small signal oscillation and the reconstructed rotor flux;

means for calculating Fourier coefficients based on the result of the comparison between the rotor flux component generated in response to the small signal oscillation and the reconstructed rotor flux; and means for updating the most recent estimate of the rotor time constant and the frequency of the small signal oscillation based on the calculated Fourier coefficients; and means for providing control instructions to the induction machine based, in part, on the most recent estimate of the rotor time constant.

18. The controller of claim 17, wherein the means for monitoring the response of the induction machine includes:

a voltage model open loop observer that measures rotor flux generated by the induction machine based on monitored voltages and current in the induction machine.

19. The controller of claim 17, further including:

means for updating the reconstructed rotor flux based, in part, on the calculated Fourier coefficients.

20. The controller of claim 17, further including:

means for updating the reconstructed rotor flux based, in part, on the updated frequency of the small signal oscillation.

21. The controller of claim 17, wherein the means for updating the most recent estimate of the rotor time constant and the frequency of the small signal oscillation includes:

means for calculating a phase difference between the rotor flux component generated in response to the small signal oscillation and the reconstructed rotor flux based on the Fourier coefficients; and means for providing the phase difference to a proportional-integral (PI) controller that updates the most recent estimate of the rotor time constant and the frequency of the small signal oscillation based on the calculated phase difference.

* * * * *